(12) United States Patent
Zhang

(10) Patent No.: US 12,362,706 B2
(45) Date of Patent: Jul. 15, 2025

(54) NON-LINEAR TRANSMISSION LINE (NLTL) FREQUENCY COMB GENERATOR AND FORMED MULTIPLIER

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 459 days.

(21) Appl. No.: 18/097,267

(22) Filed: Jan. 15, 2023

(65) Prior Publication Data

US 2024/0204728 A1 Jun. 20, 2024

(30) Foreign Application Priority Data

Dec. 14, 2022 (CN) .......................... 202211608380.8

(51) Int. Cl.
*H03B 19/18* (2006.01)
*H03B 19/05* (2006.01)

(52) U.S. Cl.
CPC ............. *H03B 19/18* (2013.01); *H03B 19/05* (2013.01); *H03B 2200/009* (2013.01)

(58) Field of Classification Search
CPC . H04B 3/00; H04B 3/02; H03B 19/18; H03B 19/05; H03B 19/16; H03B 19/00; H03K 3/02; H03K 5/01; H03K 5/13; H03K 5/145; H03K 4/00; H03K 4/06; H03H 7/52

USPC ................ 307/106, 108; 327/100, 124–126, 327/128–131, 181

See application file for complete search history.

(56) References Cited

U.S. PATENT DOCUMENTS

| | | | |
|---|---|---|---|
| 8,878,575 B1 | 11/2014 | Blumke et al. | |
| 11,558,036 B2* | 1/2023 | Doynov | ............... H03B 5/1841 |
| 11,791,808 B1* | 10/2023 | Zhang | ..................... H03K 5/13 |
| | | | 327/131 |

* cited by examiner

*Primary Examiner* — Hai L Nguyen
(74) *Attorney, Agent, or Firm* — Michael North

(57) ABSTRACT

Various NLTL frequency comb generator embodiments are disclosed for compressing rise time, fall time, or both rise time and fall time of an input signal to generate an output signal comprising multiple harmonics of the input signal. The NLTL frequency comb generator may comprise a plurality of segments cascaded in series with each segment comprising a series inductor, a shunt capacitor, and a reverse shunt capacitor for balanced signal compression. The shunt capacitor and the reverse shunt capacitor may be varactors or Schottky diodes that have voltage-dependent capacitance. As a result, both rise time and fall time of the input signal are compressed along the NLTL frequency comb generator. With a sinusoidal signal input, the output signal may be close to a square wave. Such a square wave output naturally suppresses all even harmonics, which can be valuable for odd harmonics signal extraction or filtration.

20 Claims, 9 Drawing Sheets

NON-LINEAR TRANSMISSION LINE (NLTL) FREQUENCY COMB GENERATOR AND FORMED MULTIPLIER

CROSS-REFERENCE TO RELATED APPLICATIONS

This application claims foreign priority to Chinese Patent Application No. 202211608380.8, entitled "NON-LINEAR TRANSMISSION LINE (NLTL) FREQUENCY COMB GENERATOR AND FORMED MULTIPLIER", naming Cemin Zhang as inventor, and filed Dec. 14, 2022, the subject matter of which is hereby incorporated herein by reference.

BACKGROUND

A. Technical Field

The present invention generally relates to frequency comb generators, and more particularly to NLTL frequency comb generators with even harmonics suppression.

B. Background of the Invention

A non-linear transmission line (NLTL) is generally an inductor-capacitor (LC) ladder network that comprises periodically loaded non-linear components, e.g., non-linear inductors or non-linear capacitors. It may be, for example, periodically loaded by reversely biased varactors or Schottky diodes. NLTL has been used in a wide range of device and system applications, including comb generator, time-domain reflectometry (TDR), frequency synthesizer, frequency multiplier, high-speed sampling oscilloscope, pulse generator, etc.

A frequency comb generator is a signal generator that generates an output signal that has appreciable signal power at multiple harmonics of an input signal. This output signal typically comprises a series of uniformly spaced frequency components so that the output signal spectrum has an appearance like that of teeth on a comb.

In certain situations, it is desirable for a frequency comb generator to generate the output signal that has signal power selectively concentrated at certain frequency harmonics for extraction or filtration of harmonics of interest. For an NLTL-based multiplier, a band-pass filter (BPF) with a high Q factor is required to reject nearby harmonics around a desirable passing band. When the NLTL-based multiplier has an input oscillator signal with a low-frequency $F_{OSC}$, it is very difficult or challenging to select a high N-th order harmonic.

Accordingly, there is a need for improved NLTL frequency comb generators to address the above issues.

SUMMARY OF THE INVENTION

The present disclosure provides embodiments for frequency comb generators with even harmonics suppression. The application of disclosed embodiments provides improved harmonics separation for signal filtration.

Various NLTL frequency comb generator embodiments are disclosed to compress rising time, fall time, or both rise time and fall time of an input signal to generate an output signal comprising multiple harmonics of the input signal. The NLTL frequency comb generator may comprise a plurality of segments cascaded in series with each segment comprising a series inductor, a shunt capacitor, and a reverse shunt capacitor for balanced signal compression. The series inductor may be transmission line inductors or spiral inductors. The shunt capacitor and the reverse shunt capacitor may be varactors or Schottky diodes that have voltage-dependent capacitance, which decreases under increasing reverse PN junction voltage bias. The shunt varactors have their cathodes coupled to corresponding series inductors, and the reverse varactors have their anodes coupled to corresponding series inductors. As a result, both rise time and fall time of the input signal are compressed simultaneously along the NLTL frequency comb generator.

In one or more embodiments, base capacitance value (capacitance value at zero voltage bias) of the shunt capacitors and the reverse shunt capacitors decrease along the plurality of segments in a signal propagation path direction. Similarly, the inductance value of the series inductor decreases along the plurality of segments in the signal propagation path direction. In other words, the base capacitance value of the shunt capacitor and the reverse shunt capacitor in a segment is more than the base capacitance value of the shunt capacitor and the reverse shunt capacitor in a subsequent segment along the signal propagation path direction.

When the input signal gets more compressed as it propagates along the NLTL frequency comb generator, it comprises more higher frequency harmonics. Subsequent segments may have series inductors, shunt capacitors, and reverse shunt capacitors in smaller sizes and inductance/capacitance values for impedance matching the increasingly higher frequency harmonics of the input signal for better comb frequency generation.

In one or more embodiments, the shunt capacitor and the reverse shunt capacitor at each segment may have different or the same base capacitance value. When the shunt capacitor and the reverse shunt capacitor at each segment have the same capacitance value, the input signal may be compressed simultaneously and symmetrically regarding rise time and fall time without increasing NLTL circuit size, which may be desirable for circuit integration. With a sinusoidal signal input, the signal at an N-th node Cn (at the N-th segment series inductor) is close to a square wave. Such a square wave output naturally suppresses all even harmonics, which can be valuable for signal extraction or filtration.

Furthermore, all the shunt capacitors and the reverse shunt capacitors along the signal propagation path may be coupled to a DC bias. The NLTL frequency comb generator may further comprise a grounded shunt branch coupled to the signal propagation path such that the DC bias of the shunt capacitors and the reverse shunt capacitors is set to DC ground. The grounded shunt branch comprises a series bias resistor and a series bias inductor to prevent radio frequency (RF) signal along the signal propagation path from leaking to DC ground via the grounded shunt branch. Alternatively, the NLTL frequency comb generator may comprise a biased shunt branch coupled to a DC bias voltage Vbias such that the DC bias of the shunt capacitors and the reverse shunt capacitors is set to the DC bias voltage Vbias, which may be pre-determined or adjustable for harmonics distribution tuning in the NLTL output signal.

For the purpose of summarizing the present disclosure, certain aspects and novel features of the inventions have been described herein. One skilled in the art shall recognize that embodiments disclosed in this invention document may be implemented with various permutations, enhancements, equivalents, combinations, and improvements, all of which should fall within the scope of the present invention.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure 1:
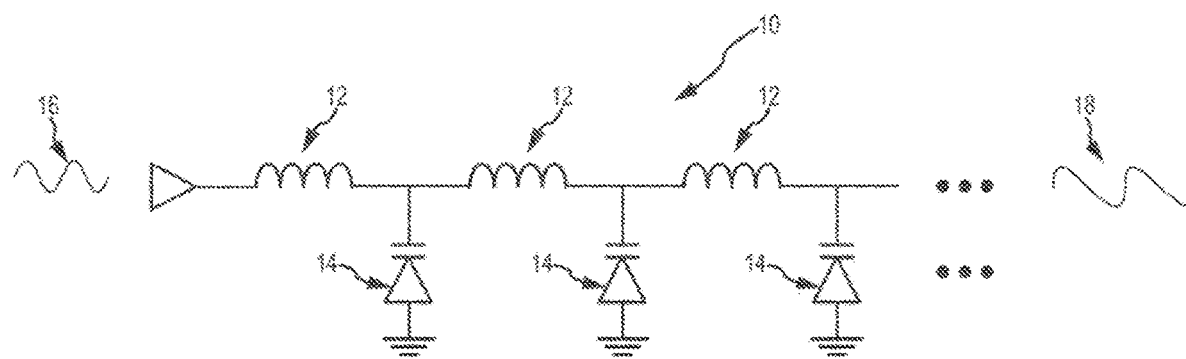
FIG. 1 depicts an equivalent circuit of a prior art NLTL.

One skilled in the art will recognize that various implementations and embodiments of the invention may be practiced in accordance with the specification. All of these implementations and embodiments are intended to be included within the scope of the invention.

DETAILED DESCRIPTION

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagrams are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention. Each reference/document mentioned in this patent document is incorporated by reference herein in its entirety. It shall be noted that any examples provided herein are provided by way of illustration and were performed under specific conditions using a specific embodiment or embodiments; accordingly, neither these examples shall be used to limit the scope of the disclosure of the current patent document.

NLTL has been used in a wide range of device and system applications, including comb generator, time-domain reflectometry (TDR), frequency synthesizer, frequency multiplier, high-speed sampling oscilloscope, and pulse generator etc. A frequency comb generator is a signal generator that generates an output signal that has appreciable signal power at multiple harmonics of an input signal. This output signal typically consists of a series of uniformly spaced frequency components, so that the output signal spectrum has an appearance like that of teeth on a comb.

The propagation phase velocity of a wave signal in a non-linear transmission line is given by:

$$V_p = \frac{1}{\sqrt{LC(V)}} \quad (1)$$

Where L is an inductance of the line and C(V) is a voltage-depending capacitance of a non-linear capacitor. The non-linear capacitor could be a varactor, a Schottky diode, or any type of PN junction diode, which features decreased junction capacitance under increased reverse PN junction voltage bias. When the capacitance decreases under increasing reverse voltage, the propagation velocity along the transmission line rises. As a result, the higher voltage part of the wave signal, e.g., the peak, travels faster and attempts to overtake the lower voltage part, thus forming a steep front shockwave whose steepness is ultimately limited by the line dispersion.

The reduction in transition time of a wave signal by an NLTL may be calculated as:

$$\Delta t = n\left(\sqrt{LC_0} - \sqrt{LC(V_{max})}\right) \quad (2)$$

Where $C_0$ is the zero-bias capacitance, $C(V_{max})$ is the capacitance under maximum reverse wave signal amplitude bias, and n is a number of sections of NLTL. Among different types of non-linear capacitor, varactor based NLTL is widely used due to its high $C(V_{max})/C_0$ ratio, which leads to a good amount of reduction in transition time for the wave signal.

U.S. Pat. No. 8,878,575B1 discloses an equivalent circuit of an NLTL 10 having a periodic structure of series inductors 12 and variable shunt capacitors 14, as shown in FIG. 1. Capacitance of the shunt capacitors 14 is voltage-dependent, e.g., the capacitance at low reverse bias is much greater than the capacitance at high reverse bias. An input signal 16 propagating on the equivalent transmission line experiences a propagation velocity that is voltage dependent. A signal that transitions from low to high voltage will be compressed in time as the initial low voltage portion of the signal travels down the line slower than the later, higher voltage portion of the signal. Consequently, the higher voltage portion of the waveform "catches up" with the lower voltage portion of the step, resulting in an increasing edge speed of the low-to-high transition, i.e., an increased slew rate. This sharper rising edge waveform produces an output signal 18 that is rich in signal harmonics in the frequency spectrum.

Embodiment 1

Figure 2:
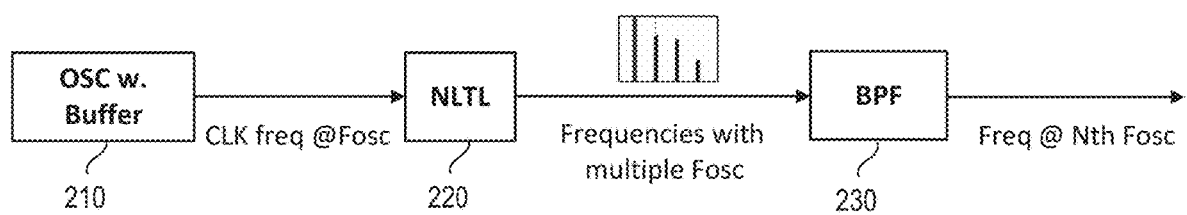
FIG. 2 depicts a low noise frequency multiplier using an NLTL, according to one or more embodiments of the invention.

FIG. 2 depicts a low noise frequency multiplier using an NLTL. An oscillator 210 outputs a signal at a clock frequency $F_{OSC}$ to an NLTL 220, which generates an output signal comprising harmonics with frequencies that are multiples of the clock frequency $F_{OSC}$. A band-pass filter (BPF) 230 receives the output signal from the NLTL 220 and outputs a frequency-multiplied signal at a desired frequency, e.g., an N-th harmonic. When the NLTL-based multiplier has an input oscillator signal with a low-frequency $F_{OSC}$, e.g., 100 MHz, it would be difficult to obtain a high-order harmonic, e.g., a 25-th harmonic (2.5 GHz). The BPF may need a high Q factor to reject nearby harmonics, e.g., 2.4 GHz and 2.6 GHz, by more than 40 dB. Such a narrow bandwidth (100 MHz) rejection at a high center frequency (e.g., 2.5 GHz) would be very challenging for implementation.

Embodiment 2

Figure 3:
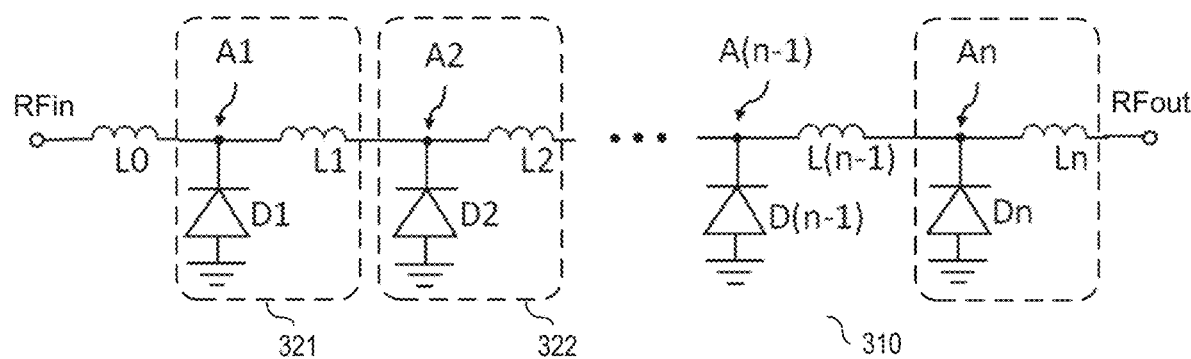
FIG. 3 depicts rise time compression along an NLTL, according to one or more embodiments of the invention.
Figure 3:
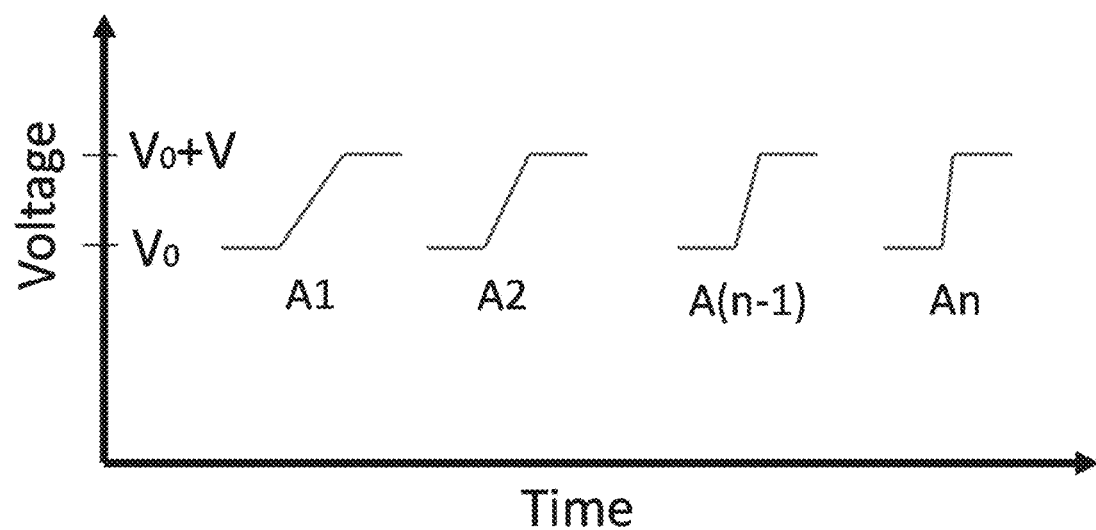

FIG. 3 depicts rise time compression along an NLTL, according to one or more embodiments of the invention. The NLTL 310 comprises a plurality of segments 321, 322, etc., cascaded in series with each segment comprising a series inductor L and a shunt capacitor D that has a variable capacitance. As shown in FIG. 3, the first segment 321 comprises a first series inductor L1 and a first shunt capacitor D1 coupled to the first series inductor L1 at a first node A1; the second segment 322 comprises a second series inductor L2 and a second shunt capacitor D2 coupled to the second series inductor L2 at a second node A2; ..., the N-th segment comprises an N-th series inductor Ln and an N-th shunt capacitor Dn coupled to the N-th series inductor Ln at an N-th node An.

An input signal RFin to the NLTL 310 passes through the plurality of cascaded segments and gets compressed along the direction of signal propagation. The shunt capacitors D1, D2, ..., and Dn may be varactors (also referred as variable capacitance diodes or varactor diodes) that have voltage-dependent capacitance, which decreases under increasing reverse voltage. As shown in the embodiment in FIG. 3, the varactors have their cathodes coupled to corresponding series inductors. As a result, the rise time or rising edge of the input signal RFin is compressed along the NLTL 310, as shown in rising slope waveforms at various nodes A1, A2, ..., An.

In one or more embodiments, the shunt capacitor at each segment may have the same base capacitance (capacitance under zero bias), and the inductor at each segment may have the same inductance. Alternatively, the series inductor and the shunt capacitor at each segment may have decreasing inductance and decreasing base capacitance, respectively, along the direction of signal propagation. When the input signal gets more compressed as it propagates along the NLTL, the input signal comprises more higher frequency harmonics. Subsequent segments may have series inductors and shunt capacitors in smaller sizes and inductance/capacitance values for impedance matching the increasingly higher frequency harmonics of the input signal with better comb frequency generation for an output signal RFout.

Embodiment 3

Figure 4:
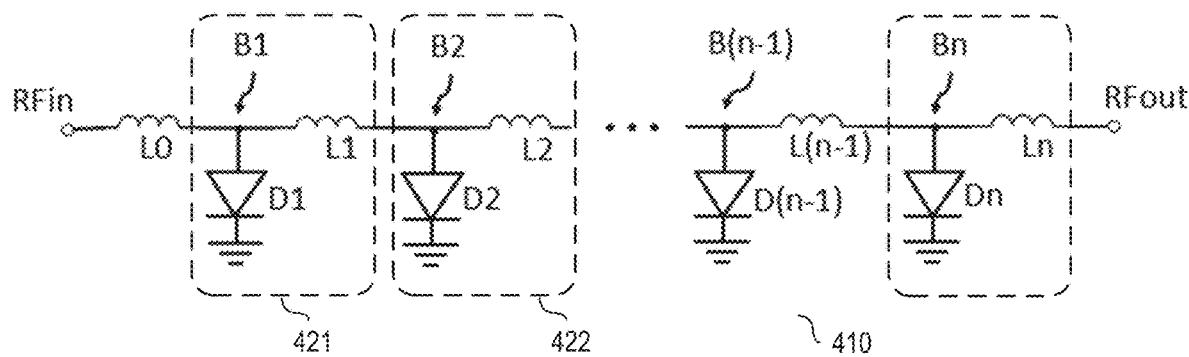
FIG. 4 depicts fall time compression along an NLTL frequency comb generator, according to one or more embodiments of the invention.
Figure 4:
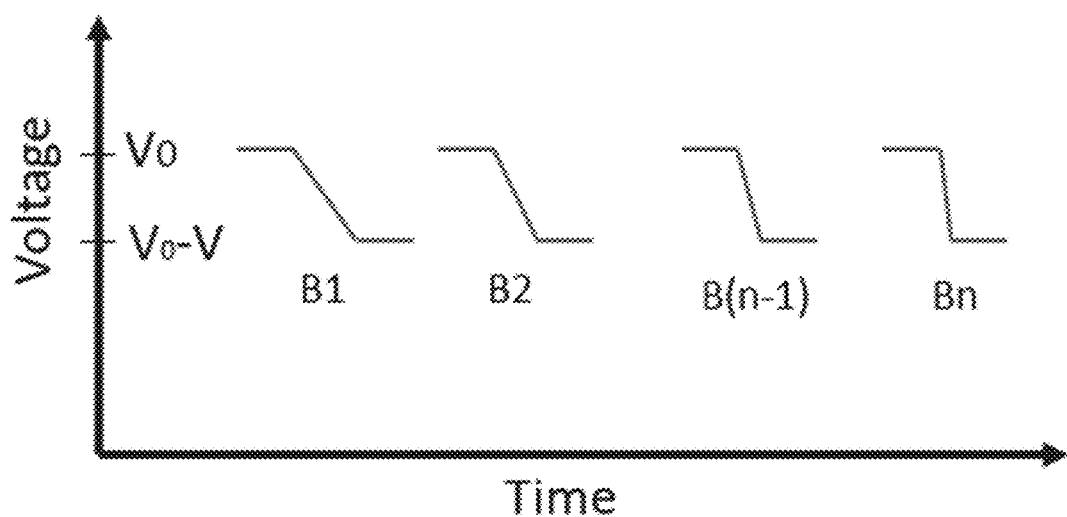

In certain situations, it is desirable to compress fall time of an input signal rather than the rise time. FIG. 4 depicts fall time compression along an NLTL frequency comb generator, according to one or more embodiments of the invention. The NLTL frequency comb generator 410 comprises a plurality of segments 421, 422, etc., cascaded in series with each segment comprising a series inductor L and a shunt capacitor D with a variable capacitance. As shown in FIG. 4, the first segment 421 comprises a first series inductor L1 and a first shunt capacitor D1 coupled to the first series inductor L1 at a first node B1; the second segment 422 comprises a second series inductor L2 and a second shunt capacitor D2 coupled to the second series inductor L2 at a second node B2; ... the N-th segment comprises an N-th series inductor Ln and an N-th shunt capacitor Dn coupled to the N-th series inductor Ln at an N-th node Bn.

The shunt capacitors D1, D2, ..., and Dn may be varactors that have voltage-dependent capacitance, which decreases under increasing reverse voltage. As shown in the embodiment in FIG. 4, the varactors have their anodes coupled to corresponding series inductors. As a result, the fall time or falling edge of the input signal RFin is compressed along the NLTL frequency comb generator 410, as shown in fall slope waveforms at various nodes B1, B2, ..., Bn. In one or more embodiments, the series inductor and the shunt capacitor at each segment may have decreasing inductance and decreasing base capacitance, respectively, along the direction of signal propagation. When the input signal gets more compressed as it propagates along the NLTL, the input signal comprises more high frequency harmonics. Subsequent segments may have series inductors and shunt capacitors in smaller sizes and inductance/capacitance values for impedance matching the increasingly higher frequency of the input signal with better comb frequency generation for an output signal RFout.

Embodiment 4

Figure 5:
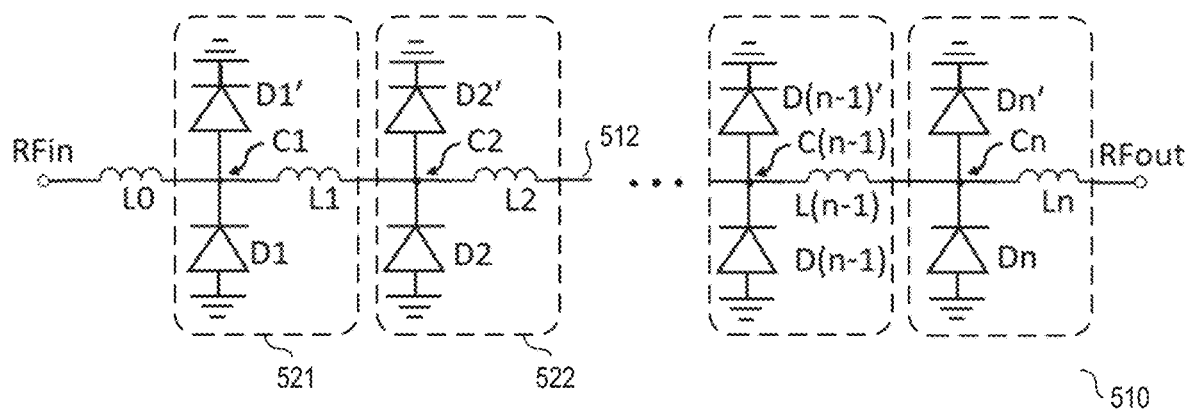
FIG. 5 depicts rise and fall time compression along an NLTL frequency comb generator, according to one or more embodiments of the invention.
Figure 5:
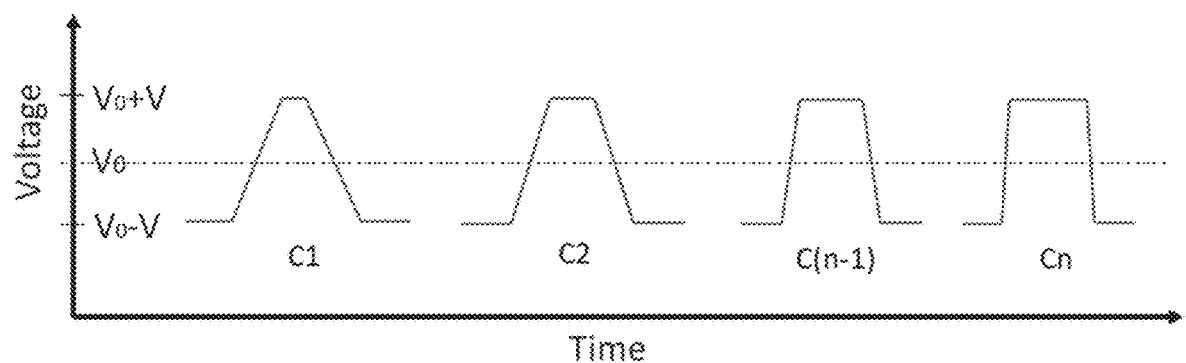

For a balanced signal compression, it may be desirable to compress both rise and fall time of an input signal simultaneously rather than compressing the rise time or fall time alone. FIG. 5 depicts rise and fall compression along an NLTL frequency comb generator, according to one or more embodiments of the invention. The NLTL frequency comb generator 510 comprises a plurality of segments 521, 522, etc., cascaded in series with each segment comprising a series inductor L, a shunt capacitor D coupled to the series inductor in a polarity, and a reverse shunt capacitor D' coupled to the series inductor in an opposite polarity of the shunt capacitor D. The shunt capacitor and the reverse shunt capacitor may be varactors that have voltage-dependent capacitance, which decreases under increasing reverse voltage. The series inductors in the plurality of segments form a signal propagation path 512 between an input signal RFin and an output signal RFout.

As shown in FIG. 5, the first segment 521 comprises a first series inductor L1, a first shunt capacitor D1 coupled to the first series inductor L1 at a first node C1, and a first reverse shunt capacitor D1' coupled to the first series inductor L1 at the first node C1; the second segment 522 comprises a second series inductor L2, a second shunt capacitor D2 coupled to the second series inductor L2 at a second node C2, and a second reverse shunt capacitor D2' coupled to the second series inductor L2 at the second node C2; ... the N-th segment comprises an N-th series inductor Ln, an N-th shunt capacitor Dn coupled to the N-th series inductor Ln at an N-th node Cn, and an N-th reverse shunt capacitor Dn' coupled to the N-th series inductor Ln at the N-th node Cn. The shunt varactors D1, D2, . . . , Dn have their cathodes coupled to corresponding series inductors, and the reverse varactors D1', D2', . . . Dn' have their anodes coupled to corresponding series inductors. As a result, both rise time and fall time of the input signal RFin are compressed along the NLTL frequency comb generator 510, as shown in rise and fall slope waveforms at various nodes C1, C2 . . . Cn.

In one or more embodiments, base capacitances (capacitance at zero voltage bias) of the shunt capacitors and the reverse shunt capacitor decrease along the plurality of segments in a signal propagation direction. Similarly, the inductance of the series inductor decreases along the plurality of segments in the signal propagation direction. In other words, the base capacitance of the shunt capacitor and the reverse shunt capacitor in a segment is more than the base capacitance of the shunt capacitor and the reverse shunt capacitor in a subsequent segment along the signal propagation direction. For example, varactors D1 and D1' in the first segment 521 have base capacitance larger than varactors D2 and D2' in the second segment 522.

When the input signal gets more compressed as it propagates along the NLTL, the input signal comprises more higher frequency harmonics. Subsequent segments may have series inductors, shunt capacitors and reverse shunt capacitors in smaller sizes and inductance/capacitance values for impedance matching the increasingly higher frequency of the input signal with better comb frequency generation for an output signal RFout.

In one or more embodiments, the shunt capacitor and the reverse shunt capacitor at each segment may have different or the same base capacitance. When the shunt capacitor and the reverse shunt capacitor at each segment have the same capacitance, the input signal may be compressed simultaneously and symmetrically regarding rise time and fall time without increasing NLTL circuit size, which may be desirable for circuit integration. As shown in FIG. 5, with a sinusoidal signal input, the signal at the N-th node Cn is close to a square wave. Such a square wave output signal naturally suppresses all even harmonics in frequency spectrum.

Figure 6:
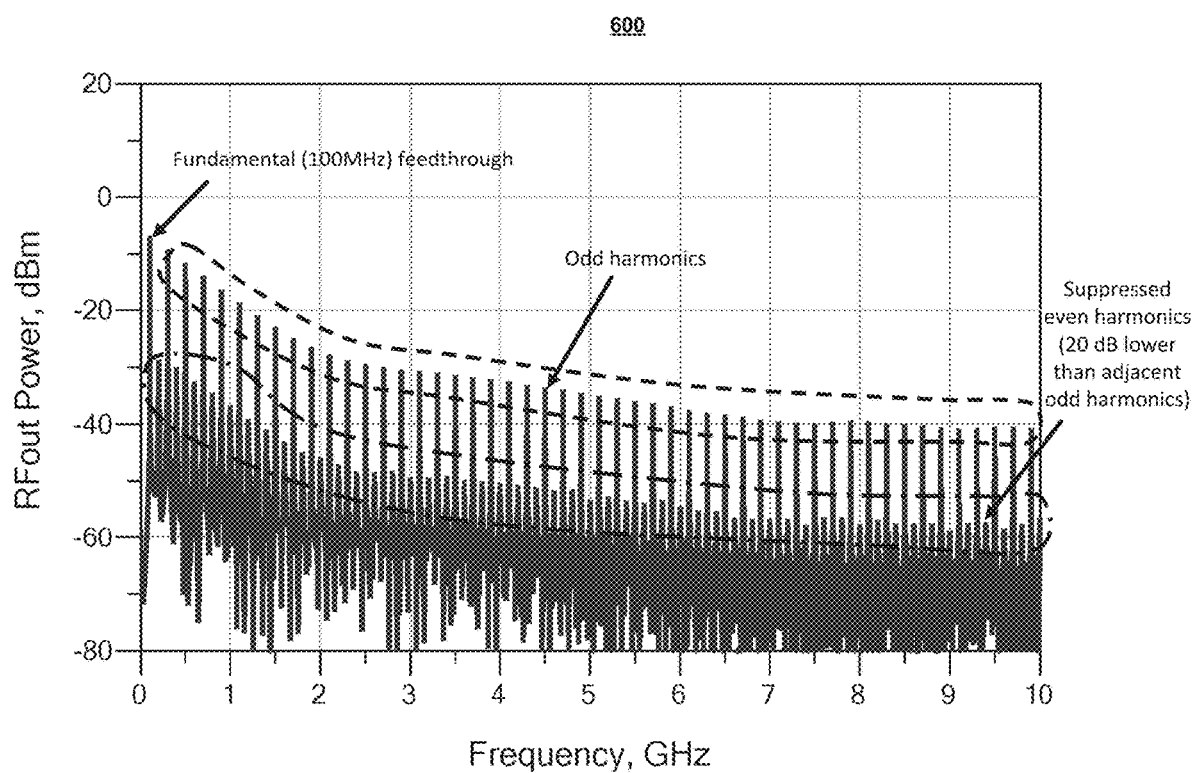
FIG. 6 depicts a frequency spectrum of an output signal from an NLTL frequency comb generator having both rise and fall time compression, according to one or more embodiments of the invention.

FIG. 6 depicts a frequency spectrum of an output signal from an NLTL frequency comb generator having both rise and fall time compression, according to one or more embodiments of the invention. With an input signal RFin of 100 MHz at 20 dBm power, the output signal RFout has multiple harmonics. As shown in FIG. 6, the even harmonics are suppressed, with a power level 20 dB lower than adjacent odd harmonics.

Such a natural suppression of even harmonics can be valuable for odd harmonics signal extraction or filtration. It is easier for BPF filtering when the NLTL frequency comb generator is used as a frequency multiplier since nearby even harmonic frequencies are suppressed naturally. Therefore, a BPF with a moderate Q value may be used for signal filtering. For example, to extract a 2.5 GHz harmonic signal, one may use a BPF with a moderate Q value having a center frequency of 2.5 GHz to reject or suppress nearby harmonics, e.g., 2.4 GHz and 2.6 GHz, by more than 20 dB instead of 40 dB. The lower rejection requirement for the BPF may significantly lower cost and complexity for signal filtering implementation.

Embodiment 5

Figure 7:
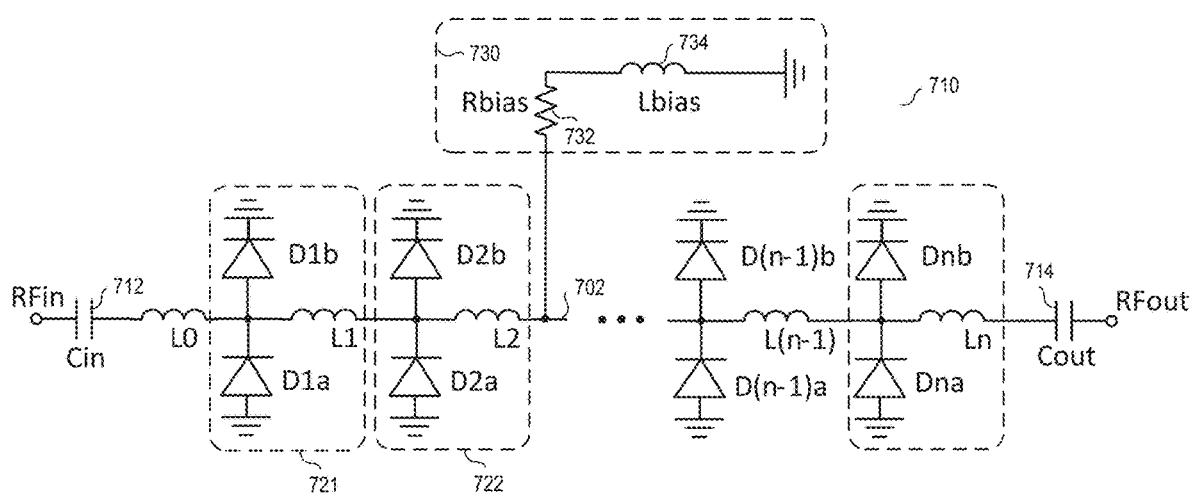
FIG. 7 depicts an alternative NLTL frequency comb generator having rise and fall time compression, according to one or more embodiments of the invention.

FIG. 7 depicts an alternative NLTL frequency comb generator having rise and fall time compression, according to one or more embodiments of the invention. Similar to the NLTL 510, the NLTL frequency comb generator 710 comprises a plurality of segments 721, 722, etc., cascaded in series with an N-th segment comprising an N-th series inductor Ln, an N-th shunt capacitor Dna, and an N-th reverse shunt capacitor Dnb. The N-th shunt capacitor Dna and the N-th reverse shunt capacitor Dnb may be varactors that have voltage-dependent capacitance, which decreases under increasing reverse voltage.

In one or more embodiments, the NLTL frequency comb generator 710 further comprises a series input capacitor Cin 712 and a series output capacitor Cout 714, both of which couple to the signal propagation path and function as a DC block to prevent DC component in the input signal RFin and the output signal RFout from passing into the NLTL 710, and to prevent any DC signals within the NLTL 710 from leaking into the input signal RFin and the output signal RFout.

In one or more embodiments, the NLTL frequency comb generator 710 may further comprise a grounded shunt branch 730 coupled to the signal propagation path 702 such that the DC bias of the shunt capacitors and the reverse shunt capacitors is set to DC ground. The grounded shunt branch 730 comprises a series bias resistor 732 and a series bias inductor 734 to prevent RF signal along the signal propagation path from leaking to DC ground via the grounded shunt branch 730. Although FIG. 7 shows only one shunt bias branch, one skilled in the art shall understand that multiple shunt bias branches may be used to provide multiple points for DC grounding along the signal propagation path.

Embodiment 6

Figure 8:
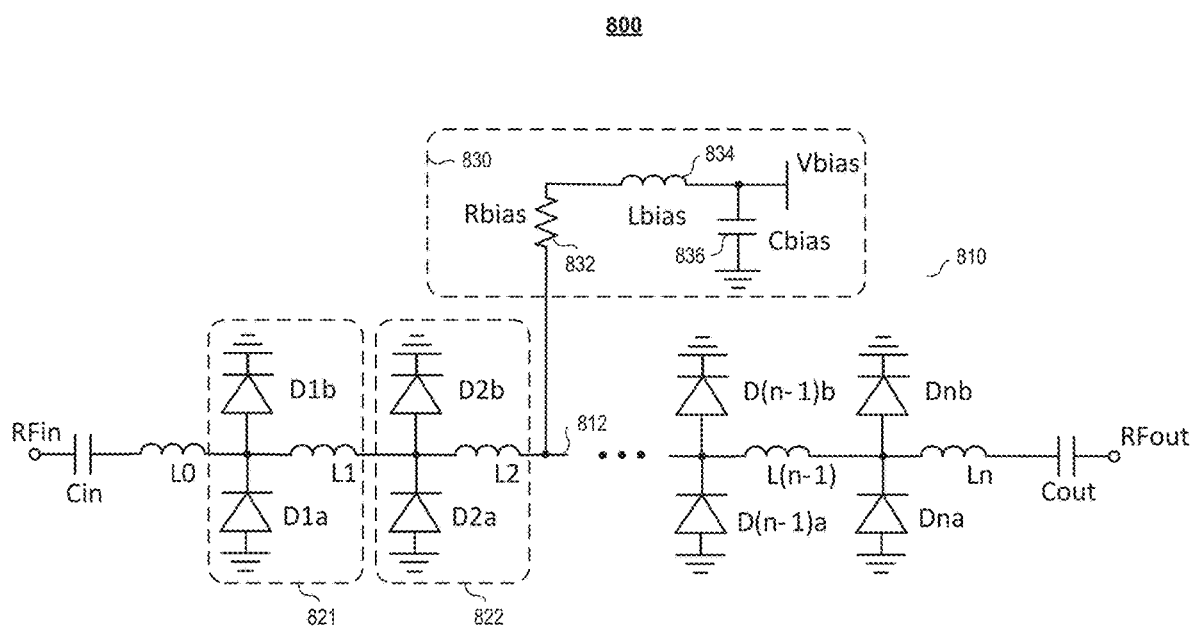
FIG. 8 depicts another alternative NLTL frequency comb generator having rise and fall time compression, according to one or more embodiments of the invention.

FIG. 8 depicts another alternative NLTL having rise and fall time compression, according to one or more embodiments of the invention. Similar to the NLTL frequency comb generator 710 shown in FIG. 7, the NLTL frequency comb generator 810 comprises a plurality of segments 821, 822, etc., cascaded in series with an N-th segment comprising an N-th series inductor Ln, an N-th shunt capacitor Dna, and an N-th reverse shunt capacitor Dnb. The N-th shunt capacitor Dna and the N-th reverse shunt capacitor Dnb may be varactors that have voltage-dependent capacitance, which decreases under increasing reverse voltage.

The NLTL frequency comb generator 810 further comprises a biased shunt branch 830 coupled between the signal propagation path 812 and a biased DC voltage Vbias such that the DC bias of the shunt capacitors and the reverse shunt capacitors is set to the biased DC voltage Vbias. The biased shunt branch 830 comprises a bias resistor 832, a bias series inductor 834, and a shunt bias capacitor 836 as a decoupling capacitor. The biased DC voltage may be pre-determined or adjustable for harmonics distribution tuning in the NLTL output signal.

Although FIG. 8 shows a biased shunt branch 830 coupled to the biased DC voltage Vbias, one skilled in the art shall understand that the biased shunt branch 830 may couple to a low-frequency signal source that output a low-frequency signal, such that the output signal RFout may be modulated with the low-frequency signal.

Embodiment 7

Figure 9:
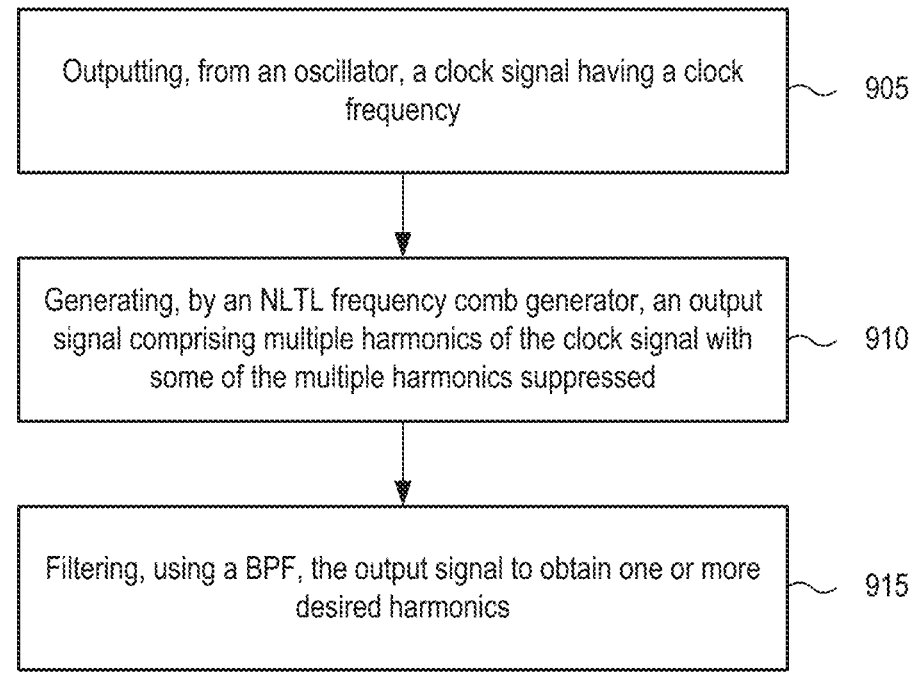
FIG. 9 depicts a process of RF harmonic signal generation, according to one or more embodiments of the invention.

FIG. 9 depicts a process of harmonic signal generation, according to one or more embodiments of the invention. In step 905, a clock signal at a clock frequency Fosc is output from an oscillator. In step 910, an NLTL frequency comb generator generates an output signal comprising multiple harmonics of the clock signal with some of the multiple harmonics suppressed. The NLTL frequency comb generator may adopt the embodiments or a combination of embodiments described above, for compression of both signal rise time and fall time, DC ground biasing, DC voltage Vbias, etc. In step 915, the output signal is filtered using a BPF to obtain one or more desired harmonics.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. A non-linear transmission line (NLTL) frequency comb generator comprising:
 a plurality of segments cascaded in series, the NLTL frequency comb generator generates an output signal comprising multiple harmonics of an input clock signal, the plurality of segments forming a signal propagation path with each segment comprising:
 a series inductor;
 a shunt capacitor coupled to the series inductor in a polarity; and
 a reverse shunt capacitor coupled to the series inductor in an opposite polarity of the shunt capacitor, the shunt capacitor and the reverse shunt capacitor have voltage-dependent capacitances that decrease under increasing reverse voltage bias.

2. The NLTL frequency comb generator of claim 1, wherein the shunt capacitor and the reverse shunt capacitor are varactors or Schottky diodes, the shunt capacitor has a cathode coupled to the series inductor, and the reverse capacitor has an anode coupled to the series inductor.

3. The NLTL frequency comb generator of claim 1, wherein the shunt capacitor and the reverse shunt capacitor in each segment have the same base capacitance, which is a capacitance under zero voltage bias.

4. The NLTL frequency comb generator of claim 3, wherein the shunt capacitor and the reverse shunt capacitor in a segment have a base capacitance more than the base capacitances of the shunt capacitor and the reverse shunt capacitor in a subsequent segment along the signal propagation path.

5. The NLTL frequency comb generator of claim 1 further comprising:
 a grounded shunt branch coupled to the signal propagation path, the grounded shunt branch comprises a series bias resistor and a series bias inductor.

6. The NLTL frequency comb generator of claim 1 further comprising:
 a biased shunt branch coupled between a DC bias and the signal propagation path, the biased shunt branch comprises a series bias resistor, a series bias inductor and a shunt bias capacitor.

7. The NLTL frequency comb generator of claim 6, wherein the DC bias has a voltage fixed or adjustable.

8. The NLTL frequency comb generator of claim 1 further comprising:
 an input capacitor coupled in series to the signal propagation path for input DC blocking; and
 an output capacitor coupled in series to the signal propagation path for output DC blocking and for output impedance matching.

9. A frequency multiplier comprising:
 an oscillator outputting a clock signal having a clock frequency;
 a non-linear transmission line (NLTL) frequency comb generator receiving the clock signal and generating an output signal that comprises multiple harmonics of the clock signal, the NLTL frequency comb generator comprises a plurality of segments cascaded in series to form a signal propagation path, each segment comprising:
 a series inductor;
 a shunt capacitor coupled to the series inductor in a polarity; and
 a reverse shunt capacitor coupled to the series inductor in an opposite polarity of the shunt capacitor, the shunt capacitor and the reverse shunt capacitor have variable capacitance; and
 a band-pass filter (BPF) filtering the output signal and outputting a frequency-multiplied signal that has a frequency multiple of the clock signal.

10. The frequency multiplier of claim 9, wherein the shunt capacitor and the reverse shunt capacitor are varactors or Schottky diodes with voltage-dependent capacitance that decreases under increasing reverse voltage bias, the shunt capacitor has a cathode coupled to the series inductor, the reverse capacitor has an anode coupled to the series inductor.

11. The frequency multiplier of claim 10, wherein the shunt capacitor and the reverse shunt capacitor in each segment have the same base capacitance, which is a capacitance under zero voltage bias.

12. The frequency multiplier of claim 11, wherein the shunt capacitor and the reverse shunt capacitor in a segment have a base capacitance more than the base capacitances of the shunt capacitor and the reverse shunt capacitor in a subsequent segment along the signal propagation path.

13. The frequency multiplier of claim 9, wherein the NLTL frequency comb generator further comprising:
 a grounded shunt branch coupled to the signal propagation path, the grounded shunt branch comprises a series bias resistor and a series bias inductor; or
 a biased shunt branch coupled between a DC bias and the signal propagation path, the biased shunt branch comprises a series bias resistor, a series bias inductor and a shunt bias capacitor.

14. The frequency multiplier of claim 9, wherein the NLTL frequency comb generator further comprising:
 an input capacitor coupled in series to the signal propagation path for input DC blocking; and
 an output capacitor coupled in series to the signal propagation for output DC blocking and for output impedance matching.

15. The frequency multiplier of claim 9, wherein the frequency-multiplied signal is an odd harmonic of the clock signal.

16. A method for harmonic signal generation comprising following steps:
   outputting, from an oscillator, a clock signal having a clock frequency; and
   generating, by a non-linear transmission line (NLTL) frequency comb generator, an output signal comprising multiple harmonics of the clock signal with one or more even harmonics suppressed, the NLTL frequency comb generator comprises a plurality of segments cascaded in series to form a signal propagation path, each segment comprising:
   a series inductor;
   a shunt capacitor coupled to the series inductor in a polarity; and
   a reverse shunt capacitor coupled to the series inductor in an opposite polarity of the shunt capacitor, the shunt capacitor and the reverse shunt capacitor have variable capacitance.

17. The method of claim 16, wherein the shunt capacitor and the reverse shunt capacitor are varactors or PN junction diodes with voltage-dependent capacitance that decreases under increasing reverse voltage bias, the shunt capacitor has a cathode coupled to the series inductor, the reverse capacitor has an anode coupled to the series inductor.

18. The method of claim 17, wherein in each segment, the shunt capacitor and the reverse shunt capacitor have the same base capacitance, which is a capacitance under zero voltage bias.

19. The method of claim 18, wherein the shunt capacitor and the reverse shunt capacitor in a segment have a base capacitance more than the base capacitances of the shunt capacitor and the reverse shunt capacitor in a subsequent segment along the signal propagation path.

20. The method of claim 17, wherein the NLTL frequency comb generator further comprising:
   a grounded shunt branch coupled to the signal propagation path, the grounded shunt branch comprises a series bias resistor and a series bias inductor; or
   a biased shunt branch coupled between a DC bias and the signal propagation path, the biased shunt branch comprises a series bias resistor, a series bias inductor and a shunt bias capacitor.

* * * * *